US009930780B1

(12) United States Patent
Ghabra et al.

(10) Patent No.: US 9,930,780 B1
(45) Date of Patent: Mar. 27, 2018

(54) REMOTE CONTROL DEVICE HAVING MOTHERBOARD AND BATTERY DAUGHTERBOARD CONNECTED BY INTERCONNECT

(71) Applicant: Lear Corporation, Southfield, MI (US)

(72) Inventors: Riad Ghabra, Northville, MI (US); William Ramsey Reynolds, Beverly Hills, MI (US); Jason Summerford, Novi, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 15/358,189

(22) Filed: Nov. 22, 2016

(51) Int. Cl.
| | | |
|---|---|---|
| H01R 13/648 | (2006.01) |
| H05K 1/14 | (2006.01) |
| H05K 1/11 | (2006.01) |
| G07C 9/00 | (2006.01) |
| G08C 17/02 | (2006.01) |
| B60R 25/40 | (2013.01) |

(52) U.S. Cl.
CPC ........... H05K 1/141 (2013.01); B60R 25/406 (2013.01); G07C 9/00111 (2013.01); G08C 17/02 (2013.01); H05K 1/115 (2013.01); H05K 1/144 (2013.01); H05K 2201/042 (2013.01); H05K 2201/048 (2013.01); H05K 2201/10037 (2013.01); H05K 2201/10098 (2013.01); H05K 2201/10318 (2013.01)

(58) Field of Classification Search
CPC .............................. H05K 1/141; B60R 25/406
USPC .................................................... 439/607.11
See application file for complete search history.

(56) References Cited

U.S. PATENT DOCUMENTS

| | | | |
|---|---|---|---|
| 3,333,225 | A | 7/1967 | McNutt |
| 4,076,356 | A | 2/1978 | Tamburro |
| 4,487,820 | A | 12/1984 | Engelstein et al. |
| 4,719,695 | A | 1/1988 | Sturner |
| 5,112,232 | A | 5/1992 | Cray et al. |
| 5,152,696 | A | 10/1992 | Krajewski et al. |
| 5,188,912 | A | 2/1993 | Katoh et al. |
| 5,588,849 | A | 12/1996 | Kile |
| 5,642,265 | A | 6/1997 | Bond et al. |
| 5,796,588 | A | 8/1998 | Machida et al. |

(Continued)

FOREIGN PATENT DOCUMENTS

CN 102489630 A 6/2012

OTHER PUBLICATIONS

Intellectual Property Office, Combined Search and Examination Report for the corresponding Great Britain Patent Application No. GB 17093711 dated Nov. 27, 2017.

*Primary Examiner* — Abdullah Riyami
*Assistant Examiner* — Nader Alhawamdeh
(74) *Attorney, Agent, or Firm* — Brooks Kushman P.C.

(57) ABSTRACT

A portable remote control device such as a key fob includes a motherboard, a battery daughterboard having a battery holder to secure a battery, and an interconnect mounting the battery daughterboard to the motherboard. The battery daughterboard may include a first via and the motherboard may include a second via in which the vias are misaligned with one another. The interconnect includes a first pin inserted through the first via and the second via to mount the battery daughterboard to the motherboard. The first pin has a disjointed configuration over a length of the pin in correspondence with a misalignment of the first via and the second via.

17 Claims, 4 Drawing Sheets

(56) References Cited

U.S. PATENT DOCUMENTS

| | | | |
|---|---|---|---|
| 6,007,389 | A | 12/1999 | Weber |
| 6,171,138 | B1 | 1/2001 | Lefebvre et al. |
| 6,515,865 | B2 | 2/2003 | Johnson et al. |
| 6,613,979 | B1 | 9/2003 | Miller et al. |
| 6,722,916 | B2 | 4/2004 | Buccinna et al. |
| 6,919,813 | B2 | 7/2005 | Barr et al. |
| 7,463,134 | B1 | 12/2008 | Stilley |
| 7,499,283 | B2 | 3/2009 | De Los Santos et al. |
| 7,557,763 | B2 * | 7/2009 | Bilyeu ............... G07C 9/00944 343/713 |
| 7,764,936 | B2 | 7/2010 | Nakasono et al. |
| 7,867,045 | B2 | 1/2011 | McAlonis |
| 8,923,002 | B2 | 12/2014 | Rapisarda |
| 9,388,998 | B2 | 7/2016 | Khoury et al. |
| 2002/0030602 | A1 | 3/2002 | Johnson et al. |
| 2002/0183009 | A1 | 12/2002 | Cruz-Albrecht et al. |
| 2004/0265686 | A1 | 12/2004 | Amatatsu et al. |
| 2006/0023422 | A1 | 2/2006 | Shum et al. |
| 2006/0029094 | A1 | 2/2006 | Chen et al. |
| 2006/0127752 | A1 | 6/2006 | Gray et al. |
| 2007/0103850 | A1 * | 5/2007 | Melman ............. G07C 9/00309 361/679.02 |
| 2007/0227866 | A1 | 10/2007 | Dimig |
| 2011/0220474 | A1 | 9/2011 | Dimig |
| 2014/0114503 | A1 * | 4/2014 | Ghabra ................... H04Q 9/00 701/2 |
| 2015/0064938 | A1 | 3/2015 | Tai |
| 2016/0028173 | A1 | 1/2016 | Bosscher et al. |

* cited by examiner

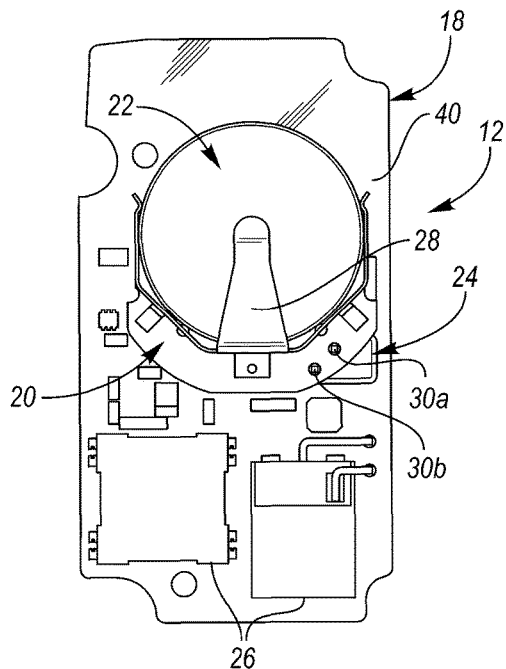
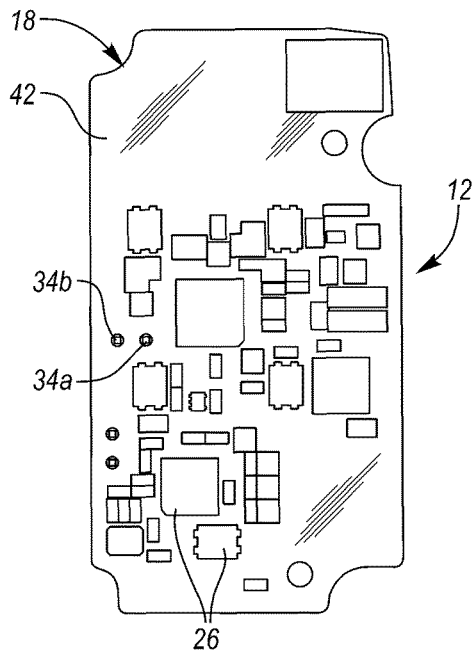
FIG. 5A
FIG. 5B
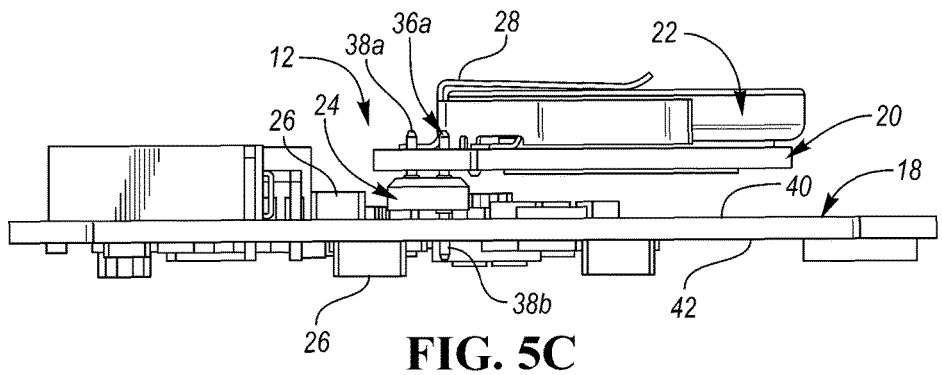
FIG. 5C
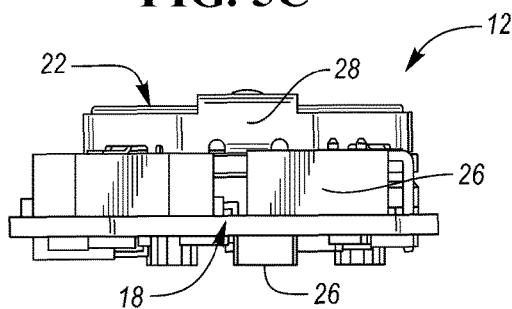
FIG. 5D

REMOTE CONTROL DEVICE HAVING MOTHERBOARD AND BATTERY DAUGHTERBOARD CONNECTED BY INTERCONNECT

TECHNICAL FIELD

The present invention relates to portable remote control devices such as key fobs.

BACKGROUND

A key fob ("fob") is an example of a portable remote control device. The fob is to be carried by a user. Requirements of the fob include providing satisfactory performance while satisfying packaging constraints.

SUMMARY

A remote control device such as a fob includes a motherboard, a battery daughterboard having a battery holder to secure a battery, and an interconnect mounting the battery daughterboard to the motherboard.

In an embodiment, the battery daughterboard includes a first via, the motherboard includes a second via, the first via and the second via are misaligned with one another, and the interconnect includes a first pin inserted through the first via and the second via to mount the battery daughterboard to the motherboard. The first pin has a disjointed configuration over a length of the pin in correspondence with a misalignment of the first via and the second via.

In an embodiment, the first pin of the interconnect includes a first linear end portion aligned with the first via, a second linear end portion aligned with the second via, and a twisted intermediate portion connected between the first linear end portion and the second linear end portion and extending in x, y, and z axes in correspondence with the misalignment of the first via and the second via.

In an embodiment, the motherboard further includes a third via, the battery daughterboard further includes a fourth via, the third via and the fourth via are physically aligned with one another, and the interconnect further includes a second pin inserted through the third via and the fourth via to mount the battery daughterboard to the motherboard.

In an embodiment, the interconnect includes a body support and the first pin and the second pin extend through the body support. The interconnect is supported on the motherboard and the body support of the interconnect includes legs to stabilize the interconnect on the motherboard. The body support of the interconnect may be a plastic body support.

A system includes a base station and a remote control device. The base station to control functions of a target device. The remote control device includes a motherboard having electrical circuit elements to wirelessly communicate with the base station to remotely control the target device, a battery daughterboard having a battery holder securing a battery, and an interconnect mechanically connecting the battery daughterboard to the motherboard and electrically connecting the battery to the motherboard for the battery to provide electrical energy to the electrical circuit elements.

An assembly includes a battery, electrical circuit elements to remotely control a target device, a motherboard having the electrical circuit elements mounted thereon, a battery daughterboard having a battery holder securing the battery to the battery daughterboard, and an interconnect mounting the battery daughterboard to the motherboard to mechanically connect the battery daughterboard to the motherboard and to electrically connect the battery to the motherboard for the battery to provide electrical energy to the electrical circuit elements.

BRIEF DESCRIPTION OF THE DRAWINGS

FIG. 5A illustrates a bottom view of the componentry of the fob in the assembled state looking toward a bottom side of the motherboard, the interconnect mounting the battery daughterboard to the bottom side of the motherboard in the assembled state;

FIG. 5B illustrates a top view of the componentry of the fob in the assembled state looking toward a top side of the motherboard;

FIG. 5C illustrates a side view of the componentry of the fob in the assembled state looking toward a longitudinal side of the motherboard, the battery daughterboard, and the interconnect;

FIG. 5D illustrates a side view of the componentry of the fob in the assembled state looking toward a lateral side of the motherboard.

DETAILED DESCRIPTION

Detailed embodiments of the present invention are disclosed herein; however, it is to be understood that the disclosed embodiments are merely exemplary of the present invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
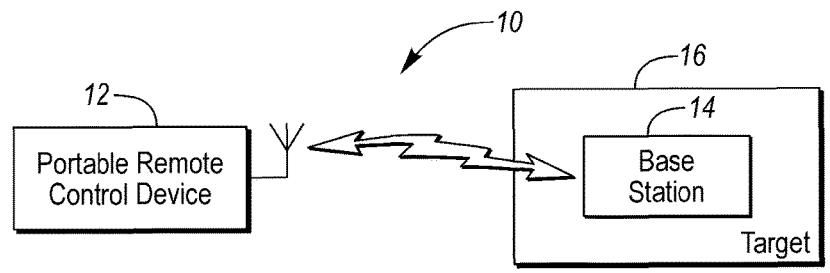
FIG. 1 illustrates a block diagram of an exemplary wireless remote control system having a portable remote control device such as a key fob ("fob")

Referring now to FIG. 1, a block diagram of an exemplary wireless remote control system 10 is shown. Remote control system 10 includes a remote control device 12 and a base station 14. Remote control device 12 is portable for being carried by a user. In the description herein, remote control device 12 will be assumed to be a key fob ("fob"). Base station 14 is at a target device 16. Base station 14 is configured to be able to control functions of target device 16. Target device 16 may be a vehicle, a house, a garage, a gate, a building, a door, a lighting system, or the like. In the description herein, target device 16 will be assumed to be a vehicle. Fob 12 and base station 14 are operable for wirelessly transmitting/receiving electro-magnetic (e.g., radio frequency (RF)) signals to/from one another to enable the fob to remotely control vehicle 16 via the base station.

Remote control system 10 may be configured to perform remote keyless entry (RKE) functions. RKE capability enables fob 12 to remotely control vehicle 16 in response to user actuation of switches, buttons, or the like of the fob. An example of a RKE function is base station 14 unlocking a vehicle door in response to receiving an unlock door command from fob 12. Fob 12 transmits the unlock door command to base station 14 in response to corresponding user actuation of the fob.

Remote control system 10 may be configured to perform passive entry passive start (PEPS) functions. PEPS capability enables remote control system 10 to remotely control vehicle 16 automatically (or "passively") without user actuation of fob 12. An example of a passive entry function is base station 14 automatically unlocking vehicle doors when the base station detects fob 12 (assumed to be authorized) to be in close proximity to vehicle 16. An example of a passive start functions is base station 14 automatically starting vehicle 16 upon a user in possession of fob 12 pressing a start button on a dashboard of the vehicle.

A consideration is that fob 12 is subject to packaging constraints requiring componentry of fob 12 to fit within a relatively small packaging space.

Figure 2:
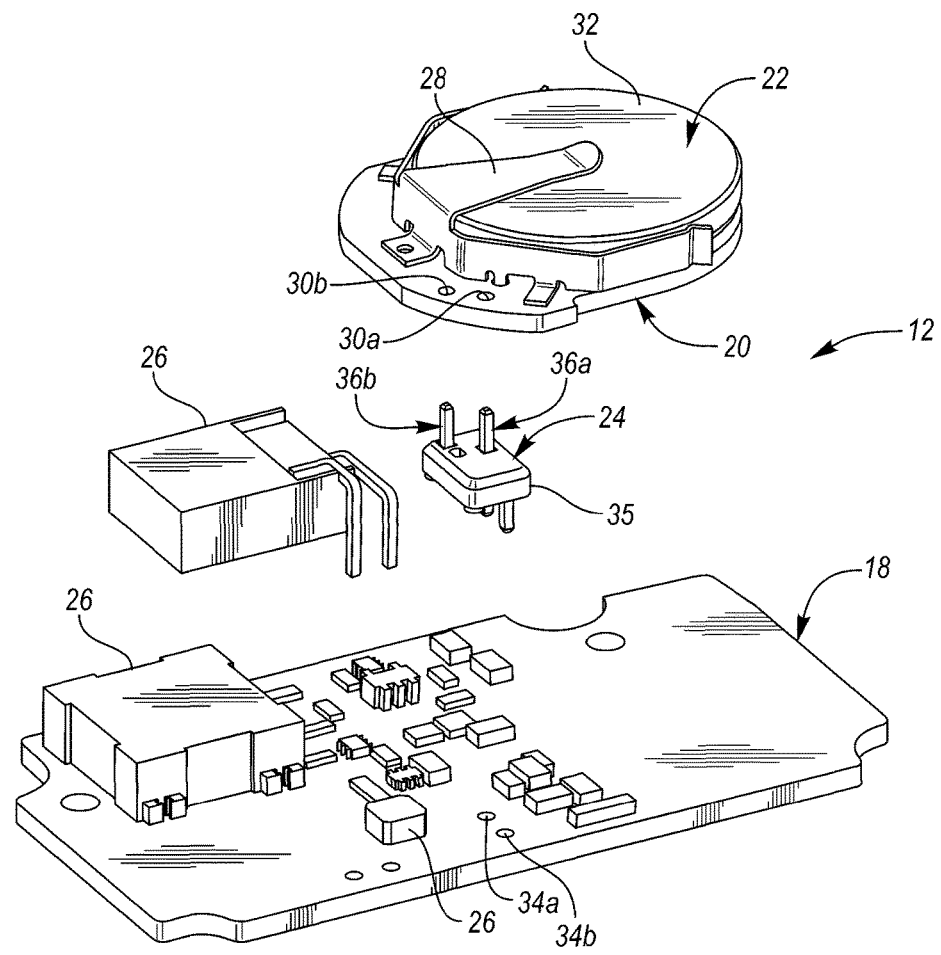
FIG. 2 illustrates an exploded view of componentry of the fob including a main printed circuit board (PCB) ("motherboard"), a daughter PCB having a battery mounted thereon ("a battery daughterboard"), and an interconnect for mounting the battery daughterboard to the motherboard and for electrically connecting the battery to the motherboard.

Referring now to FIG. 2, an exploded view of componentry of fob 12 is shown. The componentry of fob 12 includes a main printed circuit board (PCB) 18 ("motherboard"), a daughter PCB 20 having a battery 22 mounted thereon ("battery daughterboard"), and an interconnect 24 (or "connector").

Motherboard 18 includes electrical circuit elements of fob 12, generally designated with reference numeral 26, mounted thereon. Electrical circuit elements 26 include, for example, processor circuitry, wireless transmitter and/or receiver circuitry, switches, and light emitting diodes (LEDs).

Battery daughterboard 20 includes a battery holder (or "battery clip") 28 mounted thereon. Battery holder 28 secures battery 22 to mount the battery to battery daughterboard 20. Battery 22 is a coin cell battery. Battery 22 is provided for powering electrical circuit elements 26 with electrical energy. Electrical energy from battery 22 powers electrical circuit elements 26 in their operations and appropriate signals are transmitted upon actuation of electrical circuit elements 26 in the form of switches.

Interconnect 24 mounts battery daughterboard 20 with battery 22 to motherboard 18. Motherboard 18 and daughterboard 20 are thereby mechanically connected. In mounting battery daughterboard 20 to motherboard 18, interconnect 24 also electrically connects battery 22 to motherboard 18. Electrically connecting battery 22 to motherboard 18 enables the battery to supply electrical energy to electrical circuit elements 26.

In further detail, battery daughterboard 20 includes a first via ("hole", "through hole", or "pin hole") 30a and a second via 30b. Battery holder 28 physically contacts an exposed surface 32 (i.e., the anode) of battery 22 and is in electrical communication (not shown) with first via 30a. As such, first via 30a is in electrical communication with the positive terminal of battery 22. An opposite surface (not visible) (i.e., the cathode) of battery 22 lies physically against a ground electrical contact surface (not shown) arranged on battery daughterboard 20. The ground electrical contact surface of battery daughterboard 20 is in electrical communication (not shown) with second via 30b. As such, second via 30b is in electrical communication with the negative terminal of battery 22. Accordingly, vias 30a and 30b are respectively in electrical communication with positive and negative terminals of battery 22 when the battery is mounted to battery daughterboard 20 by battery holder 28. (The configuration of vias 30a and 30b and the positive and negative terminals of battery 22 can be reversed.)

Motherboard 18 includes a first via 34a and a second via 34b. First via 34a and second via 34b of motherboard 18 are in electrical communication with positive and negative, respectively, voltage supply lines of the motherboard (not shown). First via 34a of motherboard 18 is to be connected to first via 30a of battery daughterboard 20 in order to be in electrical communication with the positive terminal of battery 22. First via 34a thus represents a positive voltage supply terminal of motherboard 18. Second via 34b of motherboard 18 is to be connected to second via 30b of battery daughterboard 20 in order to be in electrical communication with the negative terminal of battery 22. Second via 34b thus represents a negative voltage supply terminal of motherboard 18.

As can be appreciated from FIG. 2, and from a comparison of FIGS. 5A and 5B, first via 30a of battery daughterboard 20 and first via 34a of motherboard 18 are physically aligned with one another whereas second via 30b of battery daughterboard 20 and second via 34b of motherboard 18 are physically misaligned with one another. The misalignment between second vias 30b and 34b is a result of the configurations of motherboard 18 and battery daughterboard 20. Motherboard 18 and battery daughterboard 20 have the configurations shown in FIG. 2, and in the other FIGS. in general, in order to enable the componentry of fob 12 to fit within a relatively small packaging space. Aligning second vias 30b and 34b requires increasing the area of battery daughterboard 20 and/or moving electrical circuit elements 26 of motherboard 18 away from the vicinity which requires increasing the area of motherboard 18. Both factors violate keeping fob 12 to a small size.

Further, mounting battery 22 directly to motherboard 18 would require allocating space on the motherboard for both of the battery and battery holder 28. Accommodating battery 22 and/or batter holder 28 on motherboard 18 would also require moving electrical circuit elements 26 away from the vicinity which requires increasing the area of the motherboard.

Interconnect 24 mounts battery daughterboard 20 to motherboard 18 by physically connecting first via 30a of battery daughterboard 20 and first via 34a of motherboard 18 together and by physically connecting second via 30b of battery daughterboard 20 and second via 34b of motherboard 18 together. In this way, battery 22 is electrically connected to motherboard 18 as first and second vias 34a and 34b of motherboard 18 are electrically connected to the positive and negative terminals, respectively, of battery 22. Electrical energy may be supplied from battery 22 to electrical circuit elements 26 through a closed circuit route including vias 30a and 30b, interconnect 24, and vias 34a and 34b.

Figure 3A:
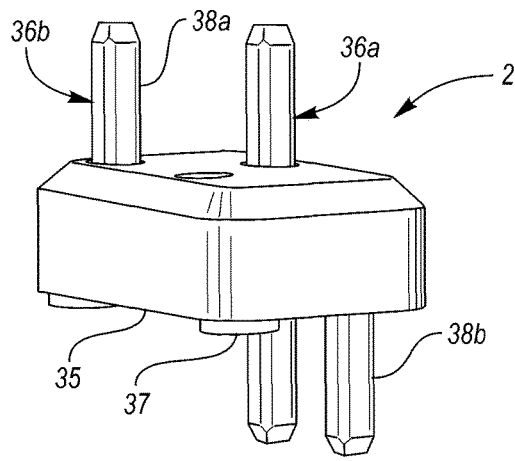
FIG. 3A illustrates a perspective view of the interconnect.
Figure 3B:
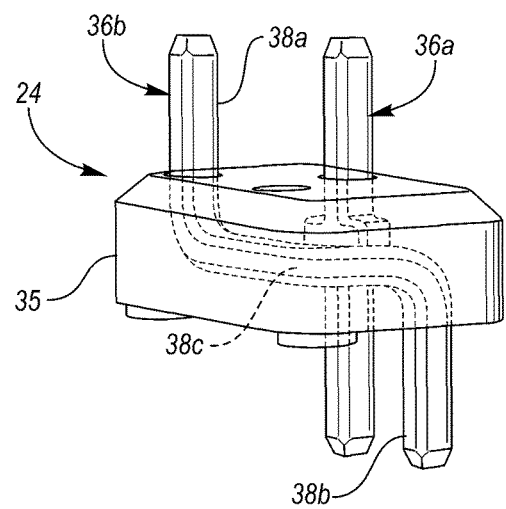
FIG. 3B illustrates in phantom the perspective view of the interconnect.

Referring now to FIGS. 3A and 3B, with continual reference to FIG. 2, perspective and phantom perspective views of interconnect 24 are respectively shown. Interconnect 24 includes a body support 35, a first pin 36a, and a second pin 36b. Body support 35 (e.g., a molded plastic assembly) supports first and second pins 36a and 36b. First and second pins 36a and 36b extend through body support 35 both above and below the body support. First and second pins 36a and 36b are electrically conductive. First pin 36a inserts through first vias 30a and 34a of battery daughterboard 20 and motherboard 18, respectively, for interconnect 24 to physically connect first vias 30a and 34a. Second pin 36b inserts through second vias 30b and 34b of battery daughterboard 20 and motherboard 18, respectively, for interconnect 24 to physically connect second vias 30b and 34b.

As shown best in FIG. 3B, first pin 36a of interconnect 24 has a straight linear extension over its entire length. The straight linear extension of first pin 36a is in correspondence with the physical alignment of first via 30a of battery daughterboard 20 and first via 34a of motherboard 18.

As also shown best in FIG. 3B, second pin 36b of interconnect 24 has a disjointed configuration over its length. The disjointed configuration of second pin 36b is in correspondence with the physical misalignment of second via 30b of battery daughterboard 20 and second via 34b of motherboard 18. In particular, second pin 36b includes a first linear end portion 38a, a second linear end portion 38b, and a twisted intermediate portion 38c. First and second linear end portions 38a and 38b are physically misaligned with one another in correspondence with the physical misalignment of second via 30b of battery daughterboard 20 and second via 34b of motherboard 18. That is, first linear end portion 38a of second pin 36b is physically aligned with second via 30b of battery daughterboard 20 and second linear end portion 38b of second pin 36b is physically aligned with second via 34b of motherboard 18.

Twisted intermediate portion 38c of second pin 36b is connected between first and second linear end portions 38a and 38b of the second pin. Twisted intermediate portion 38c extends in the x, y, and z axes in being connected between first and second linear end portions 38a and 38b, as best shown in FIG. 3B, to account for the physical misalignment between the first and second linear end portions. As such, second pin 36b is a "twisted" pin which allows for the connection of misaligned vias.

Figure 4A:
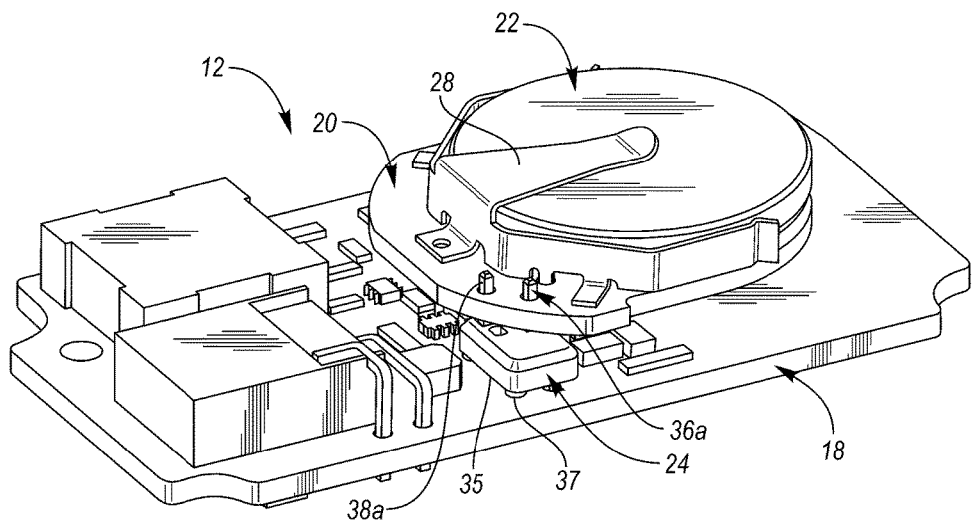
FIG. 4A illustrates a tilted perspective view of the componentry of the fob in an assembled state in which the interconnect mounts the battery daughterboard to the motherboard and electrically connects the battery to the motherboard.
Figure 4B:
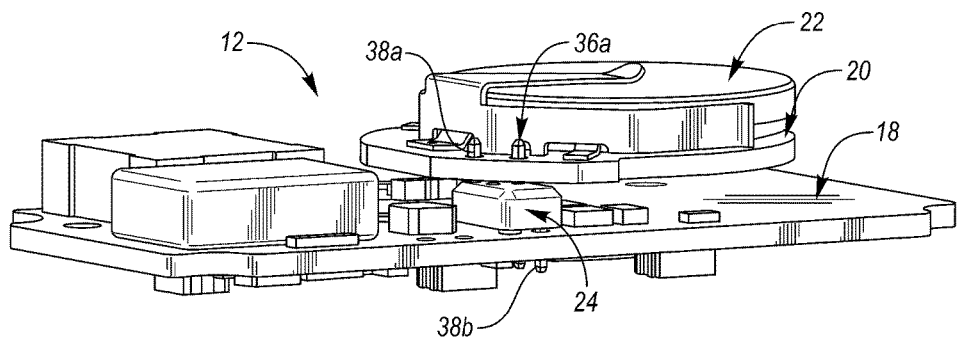
FIG. 4B illustrates a side perspective view of the componentry of the fob in the assembled state.

Referring now to FIGS. 4A and 4B, with continual reference to FIGS. 2, 3A, and 3B, respective tilted and side perspective views of the componentry of fob 12 in an assembled state are shown. In the assembled state, interconnect 24 mounts battery daughterboard 20 to motherboard 18 and electrically connects battery 22 to the motherboard as described herein.

In mounting battery daughterboard 20 to motherboard 18, interconnect 24 is supported on motherboard 18. At least a portion of interconnect 24 is between motherboard 18 and battery daughterboard 20. Body support 35 of interconnect 24 includes plastic legs 37 (labeled in FIGS. 3A and 4A) which stabilize interconnect 24 on motherboard 18. Further, the molded plastic assembly of body support 35 facilitates ease of assembly of interconnect 24 into its position in the assembled state of the componentry of fob 12.

In FIGS. 4A and 4B, the insertions of (i) first pin 36a of interconnect 24 through first via 30a of battery daughterboard 20 and (ii) first linear end portion 38a of second pin 36b of the interconnect through second via 30b of the battery daughterboard are shown. In FIG. 4B, the insertion of second linear end portion 38b of second pin 36b of interconnect 24 through second via 34b of motherboard 18 is shown.

Referring now to FIGS. 5A, 5B, 5C, and 5D, other views of the componentry of fob 12 in the assembled state are shown. In particular, FIG. 5A illustrates a bottom view looking toward a bottom side 40 of motherboard 18. Interconnect 24 mounts battery daughterboard 20 to bottom side 40 of motherboard 18 in the assembled state. FIG. 5B illustrates a top view looking toward a top side 42 of motherboard 18. Additional electrical circuit elements 26 of fob 12 such as switches are mounted on top side 42 of motherboard 18 (also shown in FIGS. 5C and 5D). The switches are actuated upon a user pressing corresponding buttons of fob 12 (shown in FIG. 6). FIG. 5C illustrates a side view looking toward a longitudinal side of motherboard 18, battery daughterboard 20, and interconnect 24. FIG. 5D illustrates a side view toward a lateral side of motherboard 18.

As can be seen from a comparison of bottom and top sides 40 and 42 of motherboard 18 shown in FIGS. 5A and 5B, first via 30a of battery daughterboard 20 and first via 34a of motherboard 18 are physically aligned with one another whereas second via 30b of the battery daughterboard and second via 34b of the motherboard are physically misaligned with one another. Twisted intermediate portion 38c of second pin 36b of interconnect 24 extends in the x and y axes (i.e., longitudinally and laterally in a plane parallel with motherboard 18) to account for the same physical x and y axes misalignment between second via 30b of battery daughterboard 20 and second via 34b of the motherboard. In this way, second pin 36b of interconnect 24 is able to insert through both of second via 30b of battery daughterboard 20 and second via 34b of motherboard 18 to electrically connect motherboard 18 to the positive and negative terminals of battery 22.

Figure 6:
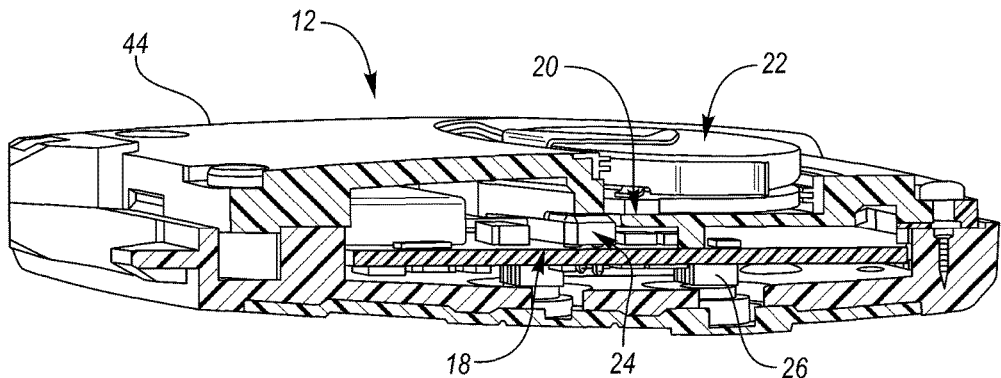
FIG. 6 illustrates a perspective, cut-away view of the fob in the assembled state.

Referring now to FIG. 6, a perspective, cut-away view of fob 12 in the assembled state is shown. As shown in FIG. 6, fob 12 includes a housing 44 with the componentry of fob 12 being packaged within a relatively small packaging space of the housing.

As described, the PCB space of fob 12 is expanded with the use of interconnect 24 configured to account for misaligned vias of two PCBs. The PCB space of fob 12 is substantially freed-up for placing electrical circuit elements 26 of fob 12 by utilizing battery daughterboard 20 containing battery 22 and its battery holder 28. Interconnect 24 with its distinguishing two pin custom arrangement connects battery daughterboard 20 to motherboard 18.

Interconnect 24 has its distinguishing two pin custom arrangement for at least the following reasons. The interconnect pin arrangement may simplify the manufacturability of connecting battery daughterboard 20 to motherboard 18 in a robust and low cost manner. The interconnect pin arrangement enables connection between pin holes (i.e., vias) that are not aligned directly on top of one another. Aligning a pair of respective pin holes of motherboard 18 and battery daughterboard 20 would have required increasing the size of the battery daughterboard which is contravenes the necessity to keep fob 12 to a small size. The interconnect pin arrangement minimizes a loop area formed by the positive and negative terminals such that the voltage supply lines are less susceptible to noise emitted from other electrical circuit elements 26 on motherboard 18. Further, the low profile of interconnect 24 enables thickness requirements of fob 12 to be met.

The use of battery daughterboard 20 allows a larger area of motherboard 18 to be used for accommodating electrical circuit elements 26 of fob 12. This is beneficial when a relatively large amount of electrical circuit elements 26 is present. When a relatively large amount of electrical circuit elements 26 is present, it is not possible to package on motherboard 18 both of (i) the electrical circuit elements and (ii) battery 22 with battery holder 28 while meeting a relatively small packaging space requirement. Packaging on motherboard 18 both of (i) electrical circuit elements 26 and (ii) battery 22 with battery holder 28 would require increasing the area of motherboard 18 which would violate the relatively small packaging space requirement.

While exemplary embodiments are described above, it is not intended that these embodiments describe all possible invention forms. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. A device comprising:
a motherboard;
a battery daughterboard having a battery holder to secure a battery;
an interconnect mounting the battery daughterboard to the motherboard; and
wherein the battery daughterboard includes a first via;
the motherboard includes a second via;
the first via and the second via are misaligned with one another; and
the interconnect includes a first pin inserted through the first via and the second via to mount the battery daughterboard to the motherboard, the first pin having a disjointed configuration over a length of the pin in correspondence with a misalignment of the first via and the second via.

2. The device of claim 1 wherein:
the first pin of the interconnect includes a first linear end portion aligned with the first via, a second linear end portion aligned with the second via, and a twisted intermediate portion connected between the first linear end portion and the second linear end portion and extending in x, y, and z axes in correspondence with the misalignment of the first via and the second via.

3. The device of claim 1 wherein:
the motherboard further includes a third via;
the battery daughterboard further includes a fourth via;
wherein the third via and the fourth via are physically aligned with one another; and
the interconnect further includes a second pin inserted through the third via and the fourth via to mount the battery daughterboard to the motherboard.

4. The device of claim 3 wherein:
the interconnect includes a body support, the first pin and the second pin extend through the body support.

5. The device of claim 4 wherein:
the interconnect is supported on the motherboard and the body support of the interconnect includes legs to stabilize the interconnect on the motherboard.

6. The device of claim 4 wherein:
the body support of the interconnect is a plastic body support.

7. The device of claim 1 wherein:
the device is a fob.

8. A system comprising:
a base station to control functions of a target device;
a device including a motherboard having electrical circuit elements to wirelessly communicate with the base station to remotely control the target device, a battery daughterboard having a battery holder securing a battery, and an interconnect mechanically connecting the battery daughterboard to the motherboard and electrically connecting the battery to the motherboard for the battery to provide electrical energy to the electrical circuit elements; and
wherein the battery daughterboard includes a first via and the motherboard includes a second via misaligned with the first via; and
the interconnect includes a first pin inserted through the first via and the second via to mechanically connect the battery daughterboard to the motherboard and to electrically connect the battery to the motherboard, the pin having a disjointed configuration in correspondence with a misalignment of the first via and the second via.

9. The system of claim 8 wherein:
the first pin of the interconnect includes a first linear end portion aligned with the first via, a second linear end portion aligned with the second via, and a twisted intermediate portion connected between the first linear end portion and the second linear end portion and extending in x, y, and z axes in correspondence with the misalignment of the first via and the second via.

10. The system of claim 8 wherein:
the motherboard includes a third via;
the battery daughterboard includes a fourth via;
wherein the third via and the fourth via are physically aligned with one another; and
the interconnect further includes a second pin inserted through the third via and the fourth via to mechanically connect the battery daughterboard to the motherboard and to electrically connect the battery to the motherboard.

11. The system of claim 10 wherein:
the interconnect includes a body support, the first pin and the second pin extend through the body support.

12. The system of claim 11 wherein:
the interconnect is supported on the motherboard and the body support of the interconnect includes legs to stabilize the interconnect on the motherboard.

13. The system of claim 11 wherein:
the body support of the interconnect is a plastic body support.

14. The system of claim 8 wherein:
the device is a fob.

15. The system of claim 8:
the target device is a vehicle.

16. An assembly comprising:
a battery;
a plurality of electrical circuit elements to remotely control a target device;
a motherboard having the plurality of electrical circuit elements mounted thereon;
a battery daughterboard having a battery holder securing the battery to the battery daughterboard;
an interconnect mounting the battery daughterboard to the motherboard to mechanically connect the battery daughterboard to the motherboard and to electrically connect the battery to the motherboard for the battery to provide electrical energy to the electrical circuit elements; and
wherein the battery daughterboard includes a first positive voltage terminal via and a first negative voltage terminal via;
the motherboard includes a second positive voltage terminal via and a second negative voltage terminal via;
a pair of the positive voltage terminal vias and the negative voltage terminal vias are misaligned with one another; and the interconnect includes a pin inserted through the pair of misaligned vias to mechanically connect the battery daughterboard to the motherboard and to electrically connect the battery to the motherboard, the pin having a disjointed configuration over a length of the pin in correspondence with misalignment of the pair of misaligned vias.

17. The assembly of claim 16 wherein:

the pin of the interconnect includes a first linear end portion aligned with a first one of the pair of misaligned vias, a second linear end portion aligned with a second one of the pair of misaligned vias, and a twisted intermediate portion connected between the first linear end portion and the second linear end portion and extending in x, y, and z axes in correspondence with the misalignment of the pair of misaligned vias.

\* \* \* \* \*